(12) United States Patent
Hsu et al.

(10) Patent No.: US 9,865,765 B2
(45) Date of Patent: Jan. 9, 2018

(54) PACKAGE STRUCTURE WITH OPTICAL BARRIER, OPTICAL PACKAGE STRUCTURE AND MANUFACTURING METHODS THEREOF

(71) Applicant: SensorTek technology Corp., Hsinchu County (TW)

(72) Inventors: Feng-Jung Hsu, Hsinchu County (TW); Chu-Yuan Yang, Hsinchu County (TW); Yuan-Ching Hsu, Hsinchu County (TW); Yi-Hua Chang, Hsinchu County (TW)

(73) Assignee: SensoTek technology Corp., Hsinchu County (TW)

( * ) Notice: Subject to any disclaimer, the term of this patent is extended or adjusted under 35 U.S.C. 154(b) by 0 days.

(21) Appl. No.: 14/822,906

(22) Filed: Aug. 11, 2015

(65) Prior Publication Data

US 2016/0111561 A1    Apr. 21, 2016

Related U.S. Application Data

(60) Provisional application No. 62/063,963, filed on Oct. 15, 2014.

(51) Int. Cl.
*H01L 31/12*  (2006.01)
*H01L 31/18*  (2006.01)
*H01L 31/0203*  (2014.01)
*H01L 31/0232*  (2014.01)
*H01L 31/173*  (2006.01)
*G01S 17/02*  (2006.01)
*G01S 7/481*  (2006.01)

(52) U.S. Cl.
CPC .......... *H01L 31/173* (2013.01); *G01S 7/4813* (2013.01); *G01S 17/026* (2013.01); *H01L 2224/48091* (2013.01); *H01L 2224/48465* (2013.01); *H01L 2224/73265* (2013.01)

(58) Field of Classification Search
CPC . H01L 31/167; H01L 25/167; H01L 31/0203; H01L 31/173; H01S 5/183; G01S 7/4813; G01S 17/026
See application file for complete search history.

(56) References Cited

U.S. PATENT DOCUMENTS 5,340,993 A * 8/1994 Salina ............... H01L 31/167
                                                250/551
7,177,686 B1 * 2/2007 Turcott ............. A61B 5/02405
                                                600/485

(Continued)

FOREIGN PATENT DOCUMENTS

CN        101777602 A    7/2010
CN        101936752 A    1/2011

(Continued)

*Primary Examiner* — Allen Parker
*Assistant Examiner* — Long H Le
(74) *Attorney, Agent, or Firm* — Winston Hsu

(57) ABSTRACT

A package structure with an optical barrier is provided. An emitter for emitting an optical signal and a detector for receiving the optical signal are disposed on a substrate. The optical barrier is disposed between the emitter and the detector for shielding the excess optical signal. A package material is used to completely cover the optical barrier, the emitter and the detector so that the optical barrier is completely disposed within the package material.

13 Claims, 16 Drawing Sheets

(56) References Cited

U.S. PATENT DOCUMENTS

| | | | |
|---|---|---|---|
| 8,604,436 B1 | 12/2013 | Patel | |
| 2010/0109021 A1* | 5/2010 | Horio | H01L 31/167 257/82 |
| 2010/0277740 A1* | 11/2010 | Hulteen | G01N 21/274 356/445 |
| 2010/0327164 A1* | 12/2010 | Costello | G01D 5/34715 250/338.1 |
| 2011/0024627 A1* | 2/2011 | Yao | G01J 1/02 250/338.4 |
| 2013/0020588 A1* | 1/2013 | Yong | H01L 33/486 257/82 |
| 2014/0191253 A1* | 7/2014 | Haslbeck | H01L 31/0203 257/82 |

FOREIGN PATENT DOCUMENTS

| | | |
|---|---|---|
| CN | 102157510 A | 8/2011 |
| CN | 103727965 A | 4/2014 |
| CN | 103748793 A | 4/2014 |

* cited by examiner

PACKAGE STRUCTURE WITH OPTICAL BARRIER, OPTICAL PACKAGE STRUCTURE AND MANUFACTURING METHODS THEREOF

CROSS REFERENCE TO RELATED APPLICATIONS

This application claims priority to U.S. Application No. 62/063,963, filed on Oct. 15, 2014.

BACKGROUND OF THE INVENTION

1. Field of the Invention

The present invention relates to a method for forming an optical package structure, and the formed optical package structure. In particular, to a package structure having an optical barrier and the manufacturing method thereof. In the optical package structure, the optical barrier is completely disposed within the package material, having the advantages such as being compatible with traditional production methods.

2. Description of the Prior Art

With the development of portable electronic products, the application of touch screens becomes increasingly common. A touch screen is a touch-enabled display panel, such as a touch sensitive transparent panel surface. A touch screen allows the user using finger or stylus to touch the screen, and to select or to move the cursor. In order to conveniently use the touch screen, an optical sensor, such as an infrared light proximity sensor (IR proximity sensor), is widely used on the handheld communications device for detecting the user's face, and to achieve the control effect in operation.

Proximity sensors applied in handheld products can be used to control the on/off switch in certain functions. For example, when the user does not use the screen, the screen will be automatically locked, thereby extending battery life. On the other hand, when the user's head or face is close to the touch screen, the touch function is automatically locked, so as to prevent the head from inadvertently touching the screen. In addition, the detecting distance of the long-distance proximity sensors is about 20-80 cm.

A proximity sensor has at least one emitter and at least one detector. To avoid signal crosstalk, in a conventional process, one method is to use the packaging material to package the emitter and the detector respectively, and next, using the metal frame or plastic cap to assemble the package structures mentioned above, used as the barrier structure having signal isolated functions. Besides, the traditional emitter has a larger emitting angle, so in order to effectively shield the optical interference between the emitter and the detector, one method for resolving the issue is shown in FIG. 12A, which shows Taiwan patent publication No. I385364. As shown in FIG. 12A, a barrier 20 is disposed between the package structure 10' and 30', in other words, the barrier 20 disposed between the emitter 10 and the detector 30. Or on the other hand, as shown in FIG. 12B, which shows Taiwan patent publication No. I438405, a barrier 20 such as a plastic or metal cap covers the package structure 10' and 30', so as to isolate the emitter 10 and the detector 30, thereby preventing the leakage light.

Another method involves after encapsulating the emitter and the detector respectively, then cutting along the perimeter of each sensor area to form the cutting path, said cutting path isolating the emitter and the detector. Or furthermore, forming the spacers on the cutting path of an exposed substrate, therefore the spacer will be disposed outside of the packaging materials. However, the method not only increases the process time, but since the spacers need additional space for accommodating them, the minimum package structure is hard to achieve.

With the trend for reducing elements' volume, all of method for forming the metal frame, plastic cap, cutting path or spacer, need high accuracy between those elements and the packaged structure, so as to form a high isolation effect sensor unit, thus greatly increasing the difficulty of the process, and also preventing the product yield from being effectively improved.

SUMMARY OF THE INVENTION

The present invention provides a package structure with an optical barrier. Since the optical barrier is disposed within the package material, the misalignment issue will not occur between the optical barrier and the package material, and therefore resolves the problems mentioned in prior arts. Preferably, the emitter directly contacts the optical barrier, to reduce the size of the elements. In the present invention, a die attachment process can be performed before the packaging process, to add the optical barrier between the emitter and the detector. Therefore, after the packaging process, the optical barrier can effectively isolate the optical interferences between the emitter and the detector, and there is no need to further perform another process (such as forming the cap). As a result, it is possible to increase the packaging process efficiently, and to achieve a minimum package.

A package structure with an optical barrier is provided. An emitter for emitting an optical signal and a detector for receiving the optical signal are disposed on a substrate. The optical barrier is disposed between the emitter and the detector for shielding the excess optical signal. A package material is used to completely cover the optical barrier, the emitter and the detector so that the optical barrier is completely disposed within the package material.

In one embodiment of the present invention, an emitting half angle of emitter is smaller than 30 degrees.

In one embodiment of the present invention, the detector for shielding the excess optical signal at least absorbs the optical signal, reflects the optical signal or deflects the optical signal.

In one embodiment of the present invention, the optical barrier at least comprises a metal, a semiconductor material or an insulating material.

In one embodiment of the present invention, the package material at least comprises epoxy resin, silicone resin or silicon compound.

In one embodiment of the present invention, the distance between a top surface of the emitter and the package material is larger than 50 μm.

In one embodiment of the present invention, the emitter directly contacts the optical barrier.

In one embodiment of the present invention, the emitter and the detector are respectively electrically connected to the substrate, and driven by an external power.

In one embodiment of the present invention, the optical barrier shields the optical signal selectively.

The present invention further provides a method for forming an optical package structure, comprising: first a substrate is provided, having an emitter for emitting and a detector for receiving the optical signal disposed thereon, and an optical barrier disposed between the emitter and the detector for shielding the excess optical signal disposed on the substrate, and a package material is used to completely cover the optical barrier, the emitter and the detector.

In one embodiment of the present invention, the invention further comprises the steps of performing a die attaching process, so as to bond the emitter, the detector and the optical barrier on the substrate.

In one embodiment of the present invention, the invention further comprises the steps: a pre-substrate is provided, having the optical barrier disposed thereon, and a die attachment process is performed, to bond the emitter and the detector on the pre-substrate.

In one embodiment of the present invention, the optical barrier and the pre-substrate are integrally formed.

In one embodiment of the present invention, an emitting half angle of the emitter is smaller than 30 degrees.

In one embodiment of the present invention, the detector for shielding the excess optical signal at least absorbs the optical signal, reflects the optical signal or deflects the optical signal.

The present invention further provides an optical package structure formed by the method for forming the optical package structure mentioned above. The advantage of the present invention resides in that there is no need to further perform another process (such as forming the cap), and it is possible to increase the packaging process efficiently.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
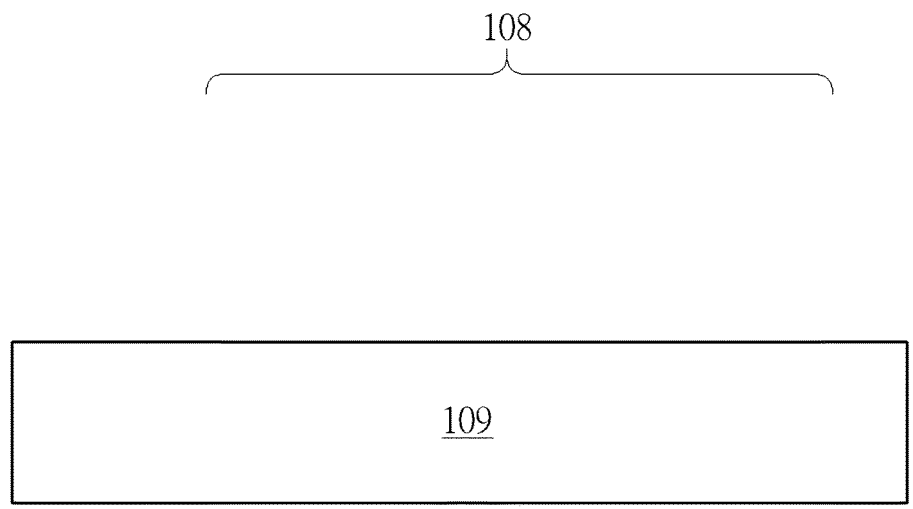
FIGS. 1-6 show a method for forming an optical package structure of the present invention.

The present invention provides a package structure with an optical barrier, a method for forming optical package structure, and the formed optical package structure. In the present invention, the package material covers the emitter, the detector and the optical barrier, so the optical barrier is sealed within the package material. Preferably, there is still a distance between the optical barrier and the surface of the package material.

The present invention provides a method for forming optical package structure. FIGS. 1-6 show a method for forming an optical package structure of the present invention. First of all, please refer to FIG. 5, in which a substrate 109 is provided. The substrate 109 includes an emitter 110, a detector 120 and an optical barrier 130 disposed thereon. The optical barrier 130 disposed between the emitter 110 and the detector 120, is used for selectively shielding the excess optical signal 111 of the emitter 110, so as to prevent the signal crosstalk between the emitter 110 and the detector 120. According to the material of the optical barrier 130, the optical barrier 130 may absorb the optical signal, reflects the optical signal or deflects the optical signal. The substrate 109 may comprise any material that is suitable for the optical package, such as silicone resin fiber glass ceramic.

The emitter 110, the detector 120 and the optical barrier 130 on the substrate 109 are also disposed within an optical sensing area 108 of the substrate 109. In addition, the emitter 110 and the detector 120 are electrically connected to two or more individual circuits to control the emitter 110 and the detector 120 respectively. For example, the methods such as die attachment or wire bonding can be used to electrically connect the emitter 110 to the circuit 106, and electrically connect the detector 120 to the circuit 107. In one embodiment of the present invention, the emitter 110 and the detector 120 is a proximity sensor, and the emitter 110 is a signal emitter, the detector 120 is a signal detector. The optical signal 111 may be a set of parallel polarized light and vertically polarized light mixing.

There may be more than one method for forming the substrate 109. For example, the emitter 110, the detector 120 and the optical barrier 130 can be formed on the substrate 109 simultaneously, or the emitter 110, the detector 120 and the optical barrier 130 can be formed on the substrate 109 in different steps. If the emitter 110, the detector 120 and the optical barrier 130 are formed on the substrate 109 simultaneously, please refer to FIG. 1, where the blank substrate 109 is firstly provided. Afterwards, a single process is carried out, such as a die attaching process, to bond the emitter 110, the detector 120 and the optical barrier 130 on the blank substrate 109 simultaneously, to obtain the structure shown in FIG. 5.

Figure 2:
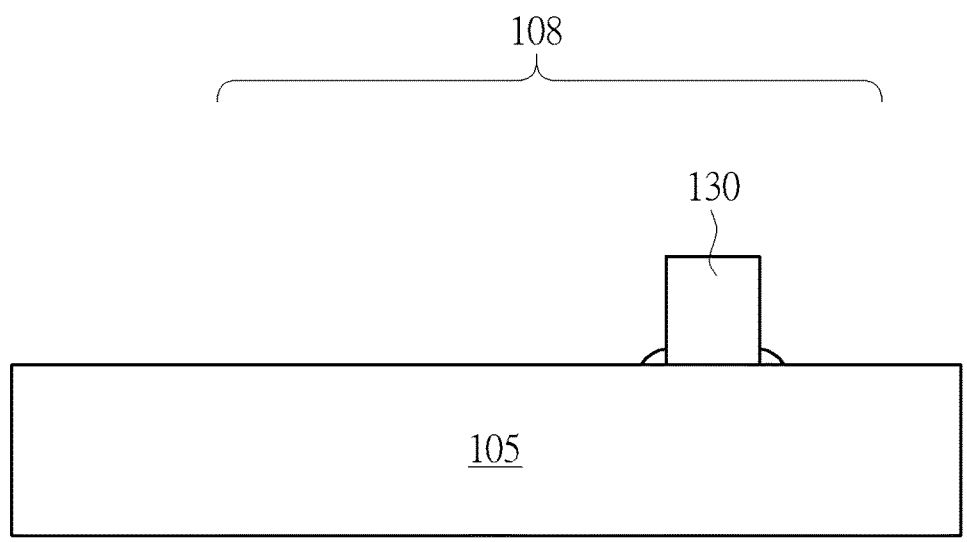
Figure 3:
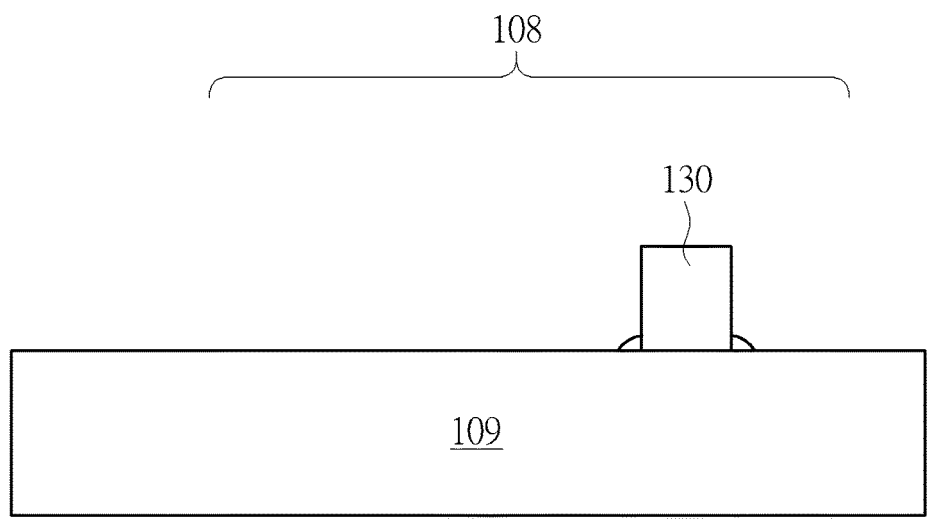
Figure 4:
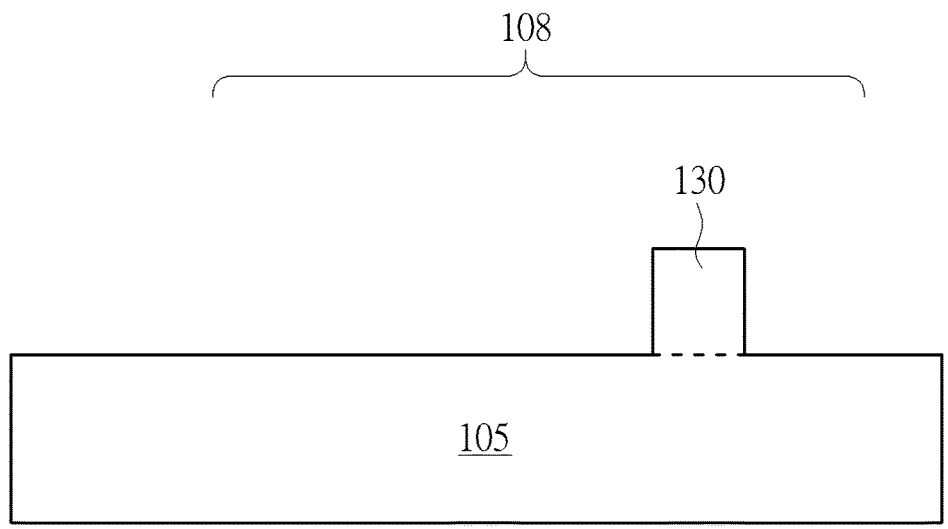
Figure 5:
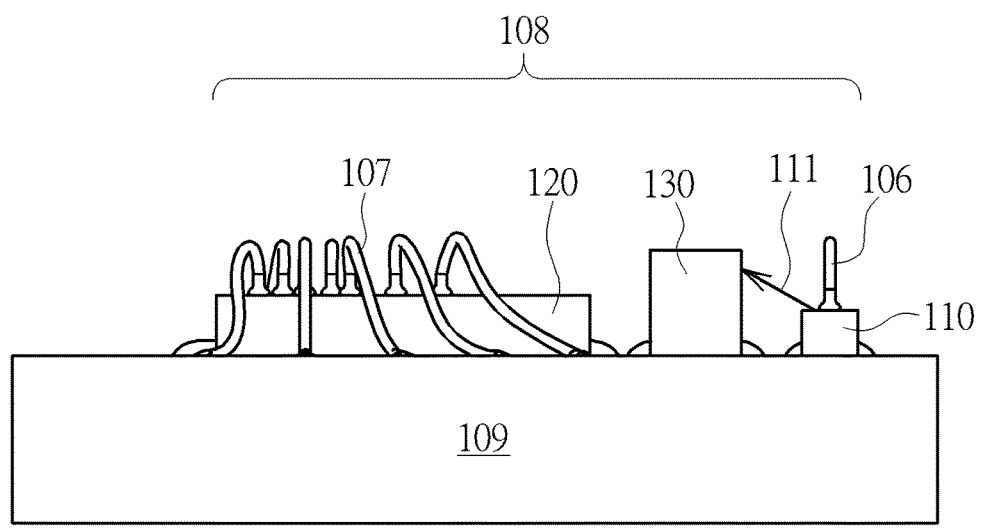

Or please refer to FIG. 2, a pre-substrate 105 having the optical barrier 130 can be provided. Next, a single process is carried out, such as a die attaching process, to bond the emitter 110 and the detector 120 on the pre-substrate 105, and on different two sides of the optical barrier 130, to obtain the structure shown in FIG. 5.

There is more than one method for forming the pre-substrate 105 having the optical barrier 130. For example, please refer to FIG. 3, a single process is carried out, such as a die attaching process, to bond the optical barrier 130 on the blank substrate 109, which is the pre-substrate 105 shown in FIG. 2. Or in another case, the optical barrier 130 and the pre-substrate 105 are integrally formed, and the pre-substrate 105 shown in FIG. 2 can be obtained. In this case, the optical barrier 130 and the pre-substrate 105 have the same material.

Figure 6:
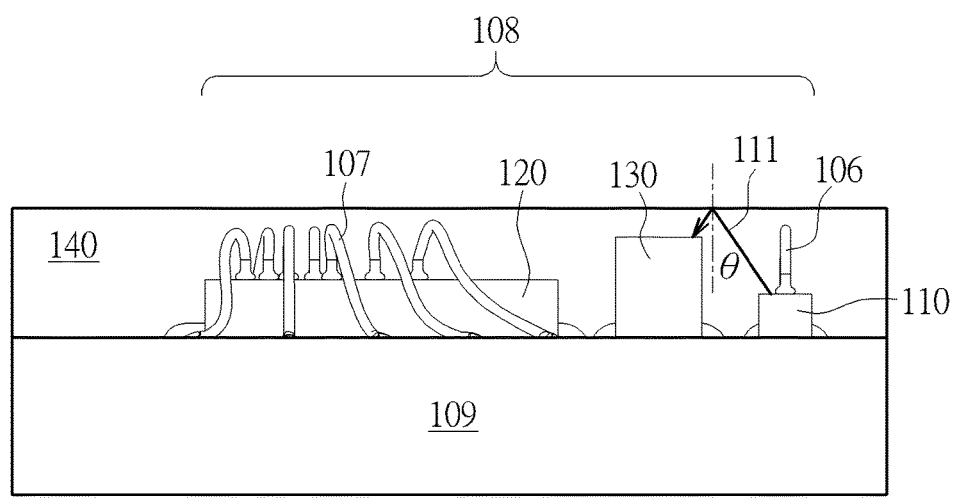

After the emitter 110, the detector 120 and the optical barrier 130 are bonded on the substrate 109, please refer to FIG. 6, using a package material 140 to entirely cover the emitter 110, the detector 120 and the optical barrier 130, so as to seal the emitter 110, the detector 120 and the optical barrier 130. Another curing process may be performed to the package material 140, so as to form the package material 140. For example, the detector 120 may be an integrated ambient and proximity sensor, or the package material 140 may be a clear molded material. Or the detector 120 is a single function IR (infrared light) proximity sensor, and the package material 140 is material that allows infrared light to pass through. The present invention does not limit the material of the package material 140, but the material of the package material 140 should be selected according to the material of the emitter 110 and the detector 120, to prevent the package material 140 from influencing the emitter 110 and the detector 120. Since the optical barrier 130 is disposed within the package material 140, in this way, the methods mentioned in the prior arts, such as forming the cutting path or adding spacers, can be omitted, thereby simplifying the manufacturing process, and keeping the advantages of being compatible with traditional manufacturing processes.

Figure 7:
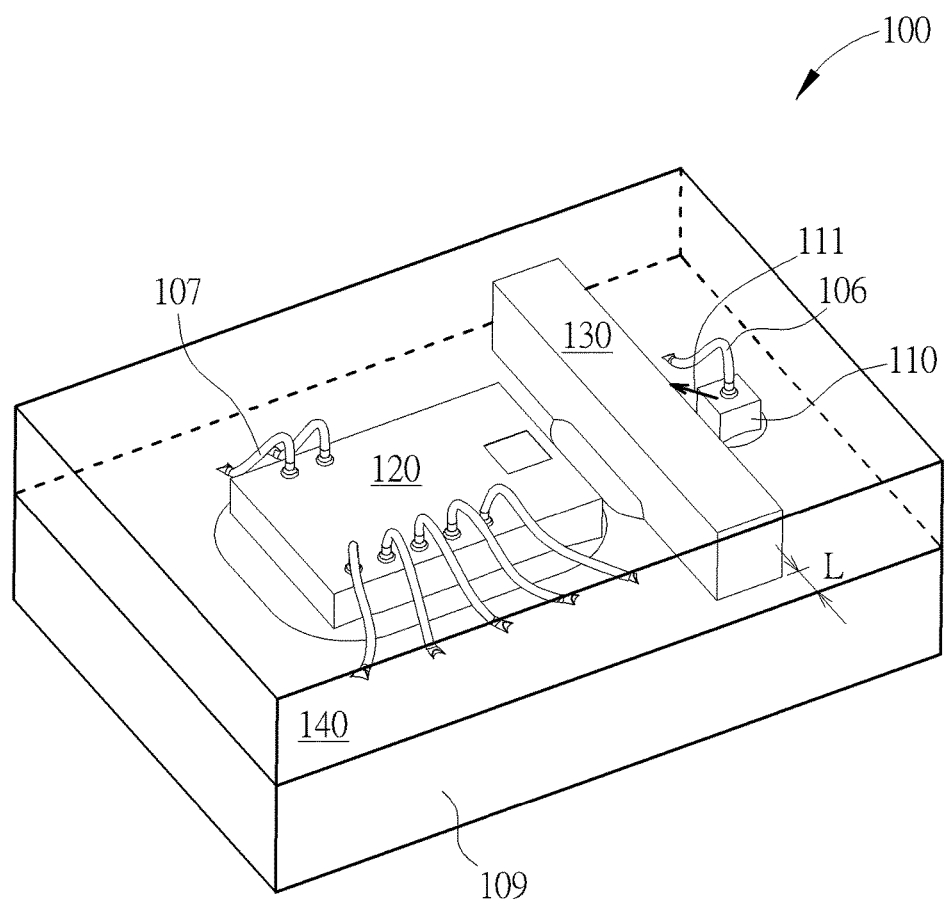
FIG. 7 shows the 3D schematic diagram of the package structure with the optical barrier.
Figure 8:
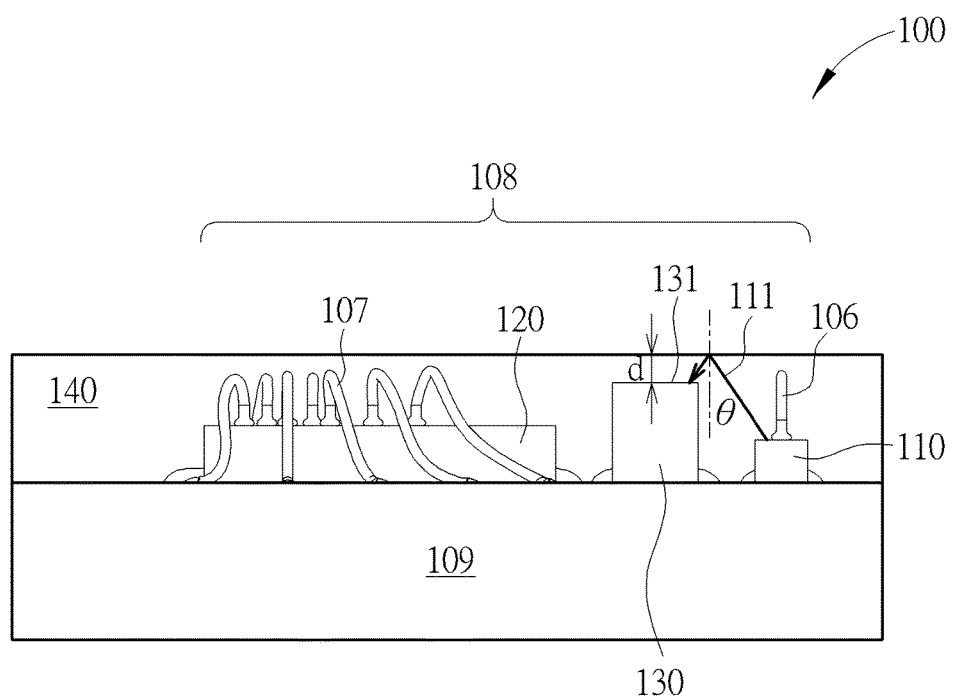
FIG. 8 shows the cross section schematic diagram of the package structure with the optical barrier.

After the methods mentioned above are performed, a package structure 100 with the optical barrier 130 can be obtained. FIG. 7 shows the 3D schematic diagram of the package structure 100 with the optical barrier 130. FIG. 8 shows the cross section schematic diagram of the package structure 100 with the optical barrier 130. Please refer to FIG. 7. The package structure 100 with the optical barrier 130 includes the substrate 109, the emitter 110, the detector 120, the optical barrier 130, and the package material 140. The substrate 109 may comprise any material that is suitable for an optical package, such as silicone resin glass ceramic.

The emitter 110 disposed on the substrate 109 is used for emitting the optical signal 111, such as infrared light signals. The optical signal 111 of the emitter 110 may also have other wavelengths. In addition, the optical signal 111 of the emitter 110 may be a continuous signal, an intermittent signal, or the combination thereof. The detector 120 disposed on the substrate 109 is used for receiving the optical signal 111 of the emitter 110. A distance L (here L is not equal to 0) is between the edge of the optical barrier 130 and the surface of the package material 140.

Please refer to FIG. 8. In one embodiment of the present invention, the half emitting angle θ of the emitter is smaller than 30 degrees. Preferably, the half emitting angle θ is quite small. For example, if the half emitting angle θ of the emitter 110 is smaller than 30 degrees, the stray light received in the inner structure, will hardly be influenced by the position of the optical barrier 130.

The emitter 110, the detector 120 and the optical barrier 130 are disposed on the substrate 109 and within the optical sensing area 108. In addition, the emitter 110 and the detector 120 are electrically connected to two or more individual circuits, used as to control the emitter 110 and the detector 120 respectively. For example, the methods such as die attachment or wire bonding can be used to electrically connect the emitter 110 to the circuit 106, and electrically connect the detector 120 to the circuit 107. In other words, the emitter 110 and the detector 120 are electrically connected to the substrate 109 respectively, and driven by the external power. In one embodiment of the present invention, the emitter 110 and the detector 120 is a proximity sensor, the emitter 110 is a signal emitter, and the detector 120 is a signal detector.

The optical barrier 130 is disposed on the substrate 109, and disposed between the emitter 110 and the detector 120, to shield the excess optical signal 111 of the emitter 110. The method for shielding the excess optical signal includes absorbing the optical signal, reflecting the optical signal or deflecting the optical signal, to avoid the interference occurs between the emitter 110 and the detector 120. The optical barrier 130 can be selected from the group of metal, semiconductor material or insulating material, such as silicon, germanium, or silicon epitaxial.

Figure 9:
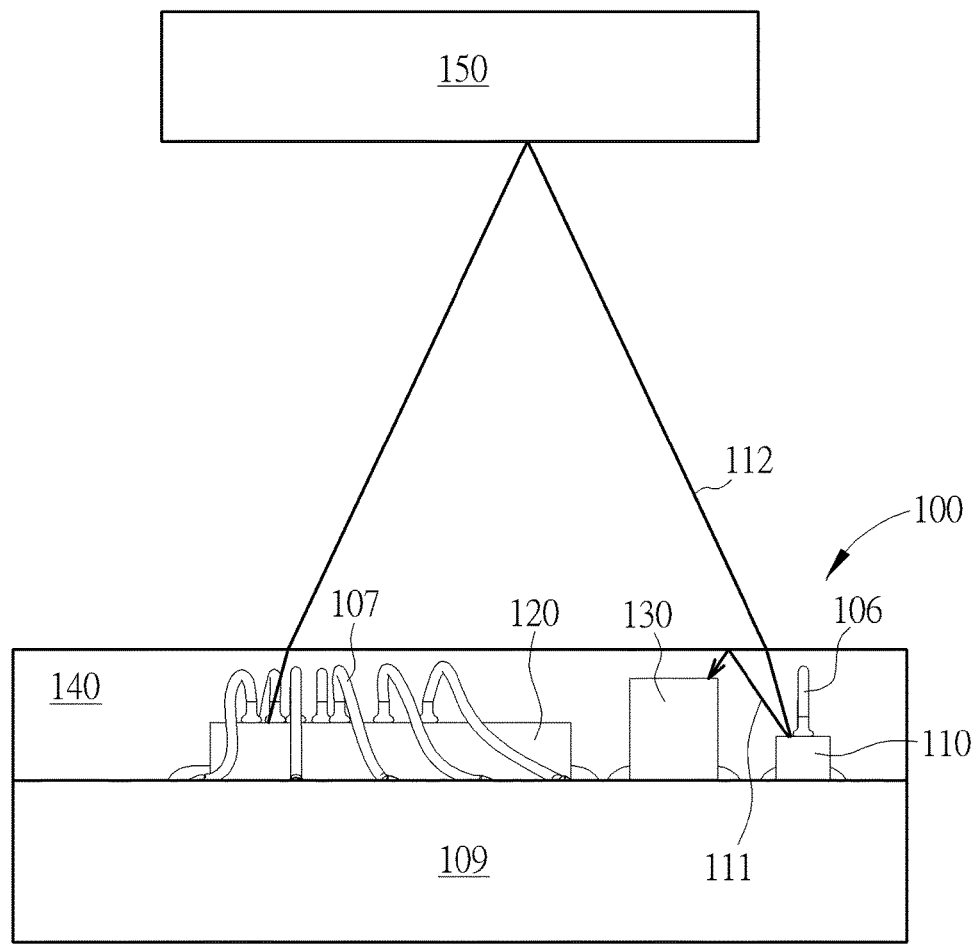
FIG. 9 shows the schematic diagram when an object close to the package structure within a specific region, the optical signal is then received by the detector.

As shown in FIG. 9, when an object 150 is close to the package structure 100 within a specific region, the optical signal 112 enters the package material 140 again through the path outside of the package structure 100, and is received by the detector 120. By adjusting the relative positions between the emitter 110, the detector 120, the optical barrier 130, and the package material 140, or by adjusting the thickness of the optical barrier 130 or the height of the package material 140, this can allow the optical signal 112 to pass through the reflection path outside of the package structure 100, and to be received by the detector 120.

The package material 140 completely covers the emitter 110 and the detector 120, so the optical barrier 130 is completely disposed within the package material 140. The package material 140 may include the material that allows the optical signal 111 to penetrate through. For example, the detector 120 is an IR proximity sensor, and the package material 140 is a material that allows the IR to pass through. The present invention does not limit the material of the package material 140, but the material of the package material 140 should be selected according to the material of the emitter 110 and the detector 120, to prevent the package material 140 from influencing the emitter 110 and the detector 120. For example, the package material 140 may be one of an epoxy, a silicone or a silicon compound. The refractive index of the package material 140 may be between 1.4-2.0.

Figure 10:
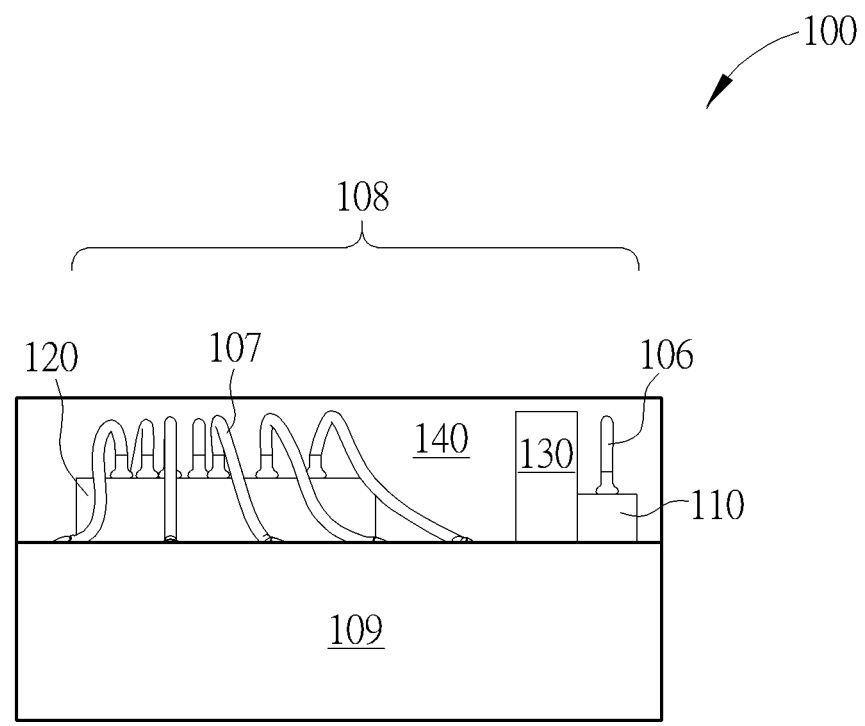
FIG. 10 shows the schematic diagram of the reduced size package structure.

In one embodiment of the present invention, as shown in FIG. 8, a distance between the top surface 131 of the optical barrier 130 and the package material 140 is the distance d being at least more than 50 μm, so as to make the half emitting angle θ of the emitter smaller than 30 degrees, such as between 0 to 30 degrees. In another case, as shown in FIG. 10, the emitter 110 directly contacts the optical barrier 130, to reduce the size of the elements, so that the package structure 100 has a smaller volume to facilitate portable electronics (not shown) having a reduced size, thereby achieving the ideal small package structure.

Figure 11A:
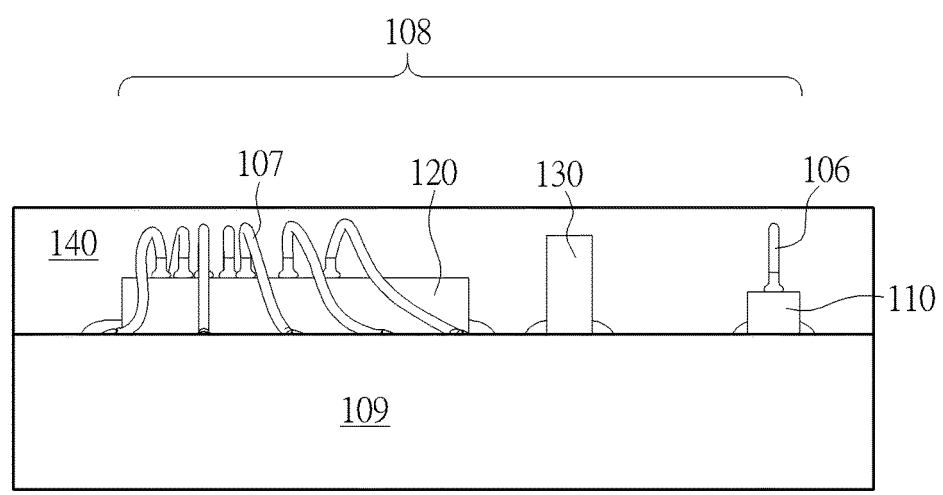
FIG. 11A shows one embodiment of the present invention.
Figure 11B:
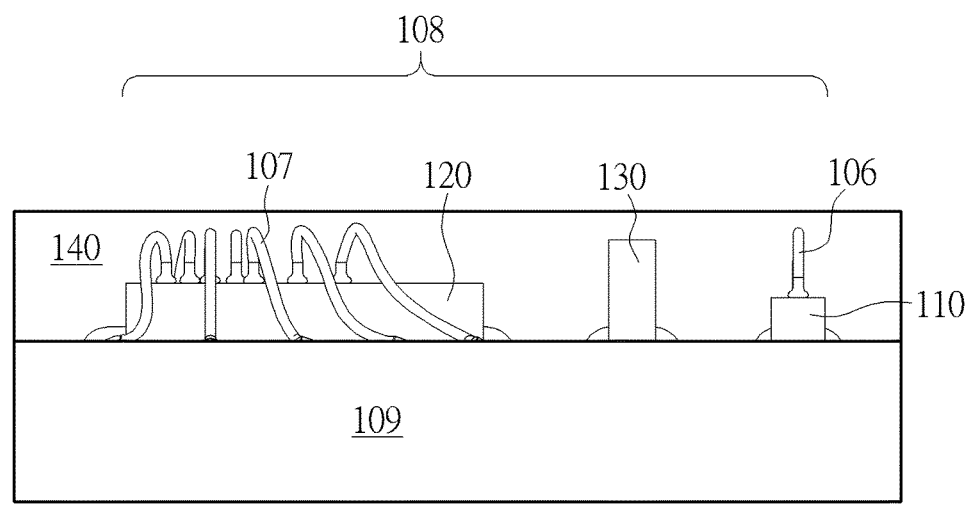
FIG. 11B shows another embodiment of the present invention.
Figure 11C:
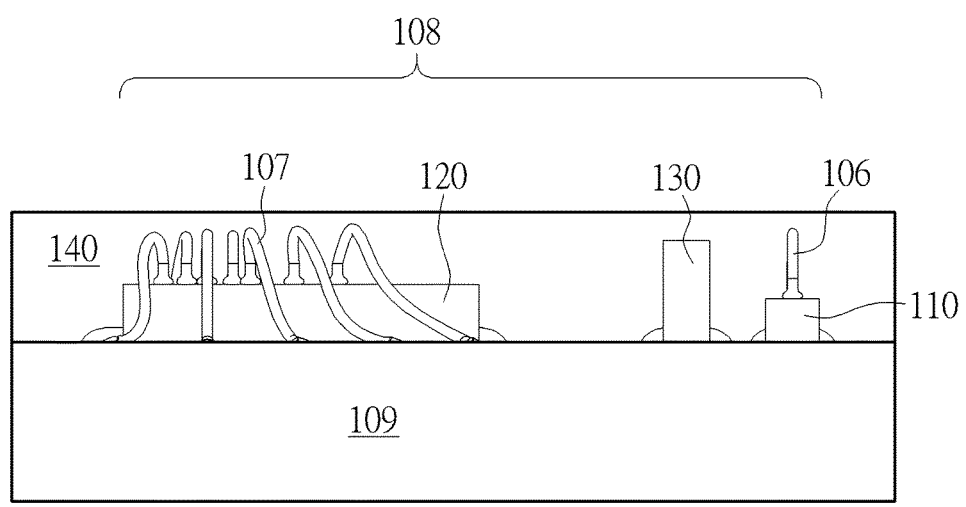
FIG. 11C shows another preferred embodiment of the present invention.

In another embodiment of the present invention, as shown in FIG. 11A, the optical barrier 130 may be disposed between the emitter 110 and the detector 120, but closer to the detector 120. Or in another case, as shown in FIG. 11B, the optical barrier 130 is just disposed on the middle point between the emitter 110 and the detector 120. Or in another case (a preferred embodiment of the present invention), as shown in FIG. 11C, the optical barrier 130 is disposed between the emitter 110 and the detector 120, but closer to the emitter 110.

Figure 11D:
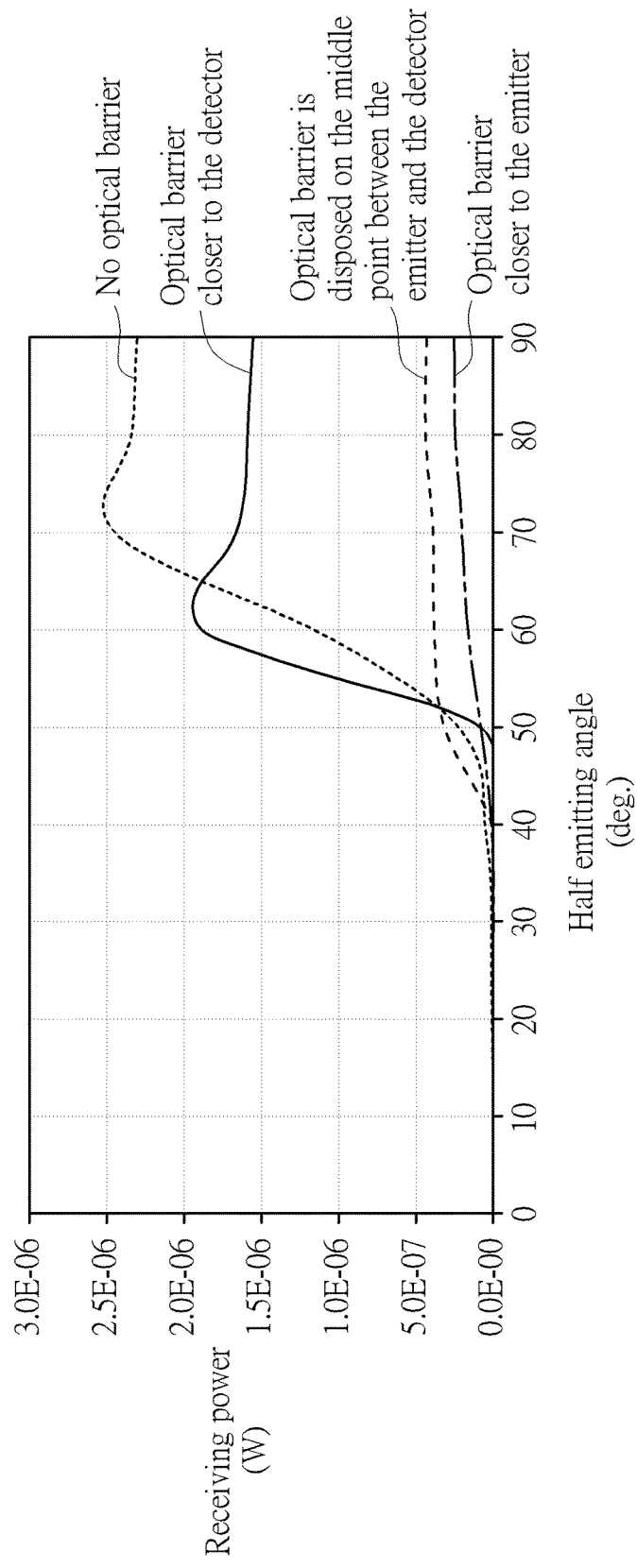
FIG. 11D shows the relationships between the position of the optical barrier, the half emitting angle θ of the emitter and the receiving power of the detector.
Figure 12A:
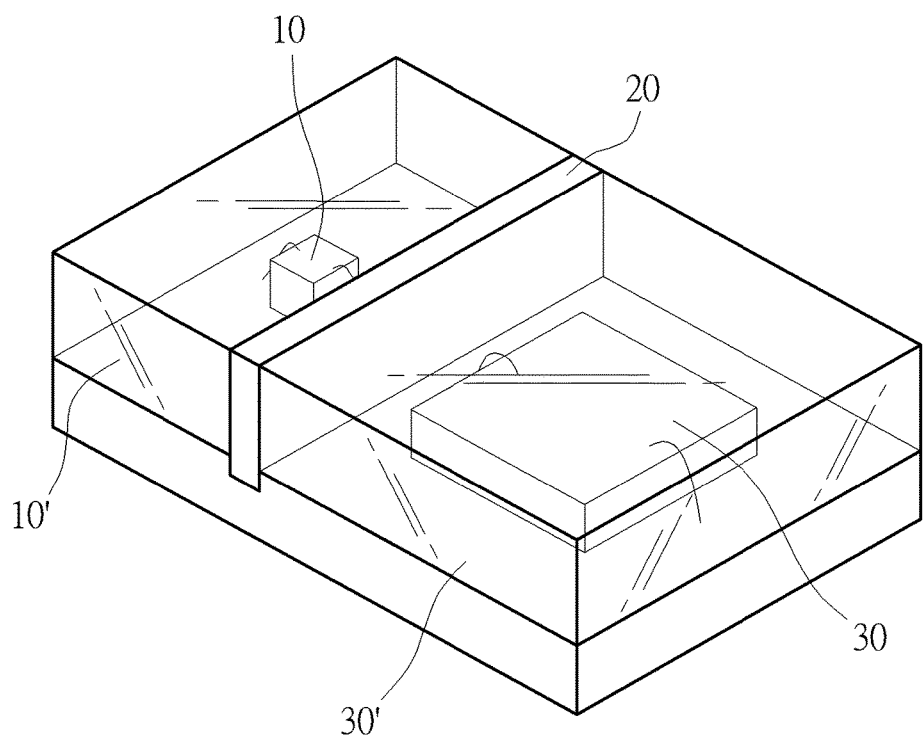
FIG. 12A shows a prior art that adding the optical barrier in a package structure.
Figure 12B:
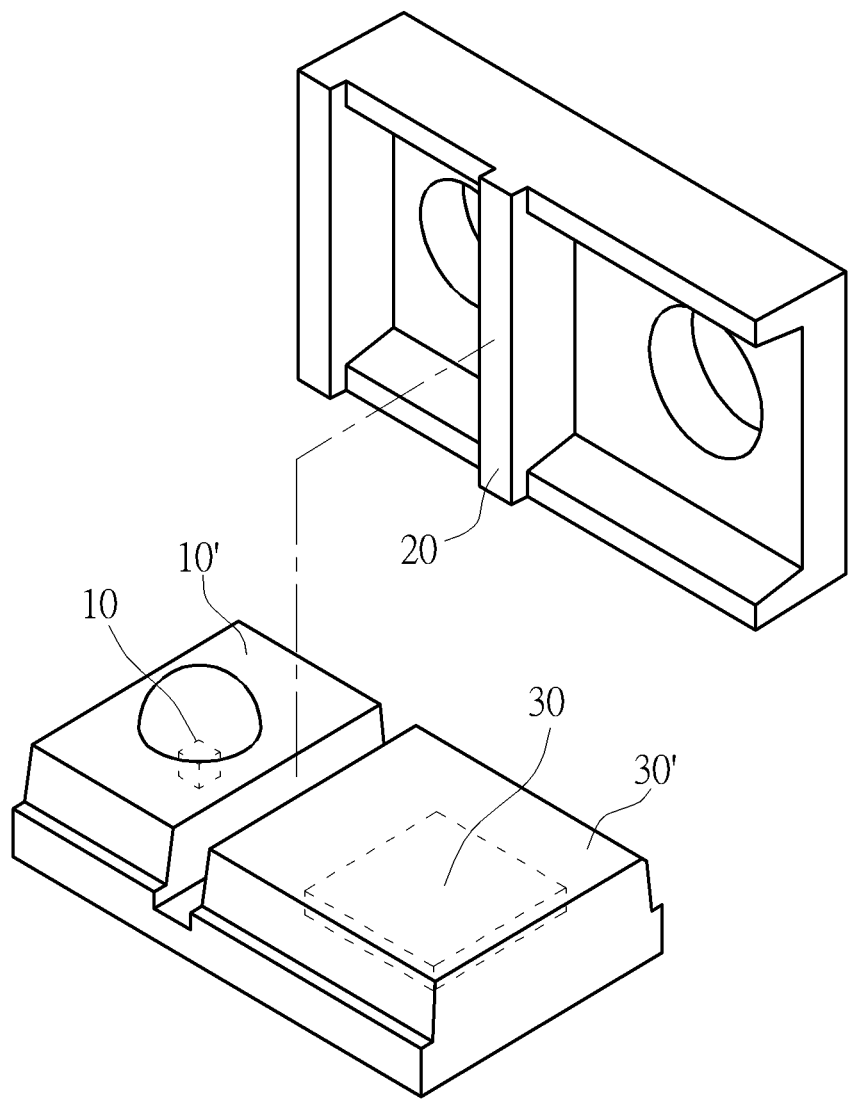
FIG. 12B shows a prior art that adding the optical barrier after the packaging process is completed.

FIG. 11D shows the relationships between the position of the optical barrier 130, the half emitting angle θ of the emitter 110 and the receiving power of the detector 120. It can be seen from the horizontal axis of FIG. 11D that the half emitting angle θ should be smaller. For example, if the half emitting angle θ of the emitter 110 is smaller than 40 degrees, the stray light received in the inner structure, will hardly be influenced by the position of the optical barrier 130. Besides, as shown in FIG. 11D, compared with the case without using the optical barrier 130, the case that uses the optical barrier 130 can effectively decrease the receiving power of the detector 120. Both the cases shown in FIG. 11B and FIG. 11C are able to obtain a better performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure with an optical barrier, comprising:
a substrate;
an emitter for emitting disposed on the substrate;
a detector for receiving the optical signal disposed on the substrate;
an optical barrier disposed between the emitter and the detector for shielding the excess optical signal, wherein the optical barrier comprises sidewalls and a top surface; and
a package material used to completely cover the optical barrier, the emitter and the detector so that the optical barrier is completely disposed within the package material, wherein the package material is in direct contact with the top surface and the sidewalls of the optical barrier, and wherein the package material is in direct contact with the substrate, wherein a half emitting angle of emitter is smaller than 30 degrees.

2. The package structure of claim 1, wherein the optical barrier for shielding the excess optical signal at least absorbs the optical signal, reflects the optical signal or deflects the optical signal.

3. The package structure of claim 1, wherein the optical barrier at least comprises a metal, a semiconductor material or an insulating material.

4. The package structure of claim 1, wherein the package material at least comprises epoxy resin, silicone resin or silicon compound.

5. The package structure of claim 1, wherein the emitter directly contacts the optical barrier.

6. The package structure of claim 1, wherein the emitter and the detector are respectively electrically connected to the substrate, and driven by an external power.

7. The package structure of claim 1, wherein the optical barrier shields the optical signal selectively.

8. A package structure with an optical barrier, comprising:
a substrate;
an emitter for emitting disposed on the substrate;
a detector for receiving the optical signal disposed on the substrate;
an optical barrier disposed between the emitter and the detector for shielding the excess optical signal, wherein the optical barrier comprises sidewalls and a top surface; and
a package material used to completely cover the optical barrier, the emitter and the detector so that the optical barrier is completely disposed within the package material, wherein the package material is in direct contact with the top surface and the sidewalls of the optical barrier, and wherein the package material is in direct contact with the substrate, wherein the distance between a top surface of the emitter and the package material is larger than 50 µm.

9. A method for forming optical package structure, comprising:
providing a substrate, having an emitter for emitting and a detector for receiving the optical signal disposed thereon, and an optical barrier disposed between the emitter and the detector for shielding the excess optical signal disposed on the substrate, wherein the optical barrier comprises sidewalls and a top surface; and
using a package material to completely cover the optical barrier, the emitter and the detector, wherein the package material is in direct contact with the top surface and the sidewalls of the optical barrier, and wherein the package material is in direct contact with the substrate, wherein a half emitting angle of emitter is smaller than 30 degrees.

10. The method of claim 9, further comprising:
bonding the emitter, the detector and the optical barrier on the substrate by performing a die attaching process.

11. The method of claim 9, wherein the optical barrier for shielding the excess optical signal at least absorbs the optical signal, reflects the optical signal or deflects the optical signal.

12. An optical package structure, which is formed through the method for forming optical package structure of claim 9.

13. A method for forming optical package structure, comprising:
providing a pre-substrate, having an optical barrier disposed thereon, wherein the optical barrier is structurally integrally formed with the pre-substrate, wherein the optical barrier comprises sidewalls and a top surface;
performing a die attachment process, to bond the emitter and the detector on the pre-substate; and
using a package material to completely cover the optical barrier, the emitter and the detector, wherein the package material is in direct contact with the top surface and the sidewalls of the optical barrier, and wherein the package material is in direct contact with the substrate.

* * * * *

UNITED STATES PATENT AND TRADEMARK OFFICE
CERTIFICATE OF CORRECTION

PATENT NO. : 9,865,765 B2  
APPLICATION NO. : 14/822906  
DATED : January 9, 2018  
INVENTOR(S) : Feng-Jung Hsu et al.

Page 1 of 1

It is certified that error appears in the above-identified patent and that said Letters Patent is hereby corrected as shown below:

On the Title Page

Item (73), correct the name of the assignee from "SensoTek technology Corp." to --SensorTek technology Corp.--.

Signed and Sealed this
Twenty-sixth Day of June, 2018

Andrei Iancu
*Director of the United States Patent and Trademark Office*